United States Patent
Jung et al.

(10) Patent No.: US 11,018,579 B2
(45) Date of Patent: May 25, 2021

(54) BOOST CONVERTER AND BOOST CONVERTER CELL

(71) Applicants: Samsung Electronics Co., Ltd., Suwon-si (KR); Research & Business Foundation SUNGKYUNKWAN UNIVERSITY, Suwon-si (KR)

(72) Inventors: Seungchul Jung, Suwon-si (KR); Sang Joon Kim, Hwaseong-si (KR); Junyoung Park, Suwon-si (KR); Yoonmyung Lee, Seongnam-si (KR); Hyungmin Gi, Suwon-si (KR)

(73) Assignees: Samsung Electronics Co., Ltd., Suwon-si (KR); Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/678,021

(22) Filed: Nov. 8, 2019

(65) Prior Publication Data

US 2020/0382000 A1     Dec. 3, 2020

(30) Foreign Application Priority Data

May 30, 2019    (KR) .................. 10-2019-0063680

(51) Int. Cl.
 *H02M 3/156*    (2006.01)
 *G06F 1/08*    (2006.01)
 *H03L 7/197*    (2006.01)

(52) U.S. Cl.
CPC ............. *H02M 3/156* (2013.01); *G06F 1/08* (2013.01); *H03L 7/1976* (2013.01)

(58) Field of Classification Search
CPC .................. H02M 3/07; H02M 3/073; H02M 2003/071–072; H02M 2003/075–078
See application file for complete search history.

(56) References Cited

U.S. PATENT DOCUMENTS 5,969,988 A * 10/1999 Tanzawa ................ G11C 5/145
                                                365/185.23
6,556,064 B1 * 4/2003 Yatabe .................... H02M 3/07
                                                307/110

(Continued)

FOREIGN PATENT DOCUMENTS

CN          203326896 U      12/2013
JP            3311018 B2      8/2002

(Continued)

OTHER PUBLICATIONS

Zhang, Xiwen et al., "A Reconfigurable 2x / 2.5x / 3x / 4x SC DC-DC Regulator for Enhancing Area and Power Efficiencies in Transcutaneous Power Transmission", *2011 IEEE Custom Integrated Circuits Conference (CICC)*. IEEE, 2011 (4 pages in English).

(Continued)

*Primary Examiner* — Thomas J. Hiltunen
(74) *Attorney, Agent, or Firm* — NSIP Law

(57) ABSTRACT

A boost converter and a cell applicable to the boost converter are provided. The cell comprises a control circuit configured to generate a bottom control signal related to a bottom plate of a capacitor, and a top control signal related to a top plate of the capacitor to connect the capacitor based on one or more operational phases, and a booster configured to convert the top control signal generated by the control circuit, wherein the capacitor is configured to be sequentially connected to voltage levels through switches, based on the bottom control signal and the converted top control signal.

18 Claims, 16 Drawing Sheets

(56) References Cited

U.S. PATENT DOCUMENTS

| | | | | |
|---|---|---|---|---|
| 7,965,130 | B1* | 6/2011 | Cook | H02M 3/073 327/536 |
| 8,289,071 | B2* | 10/2012 | Miyazaki | H02M 3/07 327/536 |
| 8,427,115 | B2* | 4/2013 | Nitta | B41J 2/04506 310/318 |
| 8,436,676 | B2* | 5/2013 | Shook | H02M 3/07 327/536 |
| 9,293,986 | B2* | 3/2016 | Thandri | H03F 3/187 |
| 9,729,048 | B2* | 8/2017 | Crandall | H02M 3/07 |
| 9,906,123 | B2* | 2/2018 | Tang | H02M 3/07 |
| 10,027,223 | B1 | 7/2018 | Zhang et al. | |
| 2002/0163376 | A1* | 11/2002 | Pappalardo | H02M 3/07 327/536 |
| 2004/0046603 | A1* | 3/2004 | Bedarida | H02M 3/073 327/536 |
| 2010/0127761 | A1* | 5/2010 | Matano | H02M 3/07 327/536 |
| 2015/0256064 | A1* | 9/2015 | Curtis | H02M 3/07 327/536 |
| 2018/0097444 | A1 | 4/2018 | Low et al. | |

FOREIGN PATENT DOCUMENTS

| | | |
|---|---|---|
| KR | 10-0315901 B1 | 12/2001 |
| KR | 10-2016-0136933 A | 11/2016 |
| KR | 10-2018-0127836 A | 11/2018 |

OTHER PUBLICATIONS

Biswas, Avishek et al., "A 28 nm FDSOI Integrated Reconfigurable Switched-Capacitor Based Step-Up DC-DC Converter With 88% Peak Efficiency", *IEEE Journal of Solid-State Circuits*, vol. 50, Issue 7, Apr. 13, 2015(1 page in English).

Ozaki, Toshihiro et al., "Fully-Integrated High-Conversion-Ratio Dual-Output Voltage Boost Converter With MPPT for Low-Voltage Energy Harvesting", *2015 IEEE Asian Solid-State Circuits Conference (A-SSCC)*, vol. 51, Issue 10, Oct. 2016 (1 page in English).

Butzen, Nicolas et al., "A Single-Toplolgy Continuously-Scalable-Conversion-Ratio Fully Integrated Switched-Capacitor DC-DC Converter with 0-to-2.22V Output and 93% Peak-Efficiency", *2018 IEEE Symposium on VLSI Circuits*. IEEE, 2018 (2 pages in English).

Butzen, Nicolas et al., "Design of Single-Topology Continuously Scalable-Conversion-Ratio Switched-Capacitor DC-DC Converrters", *IEEE Journal of Solid-State Circuits*, vol. 54, Issue 4, Apr. 2019 (1 page in English).

\* cited by examiner

FIG. 1A
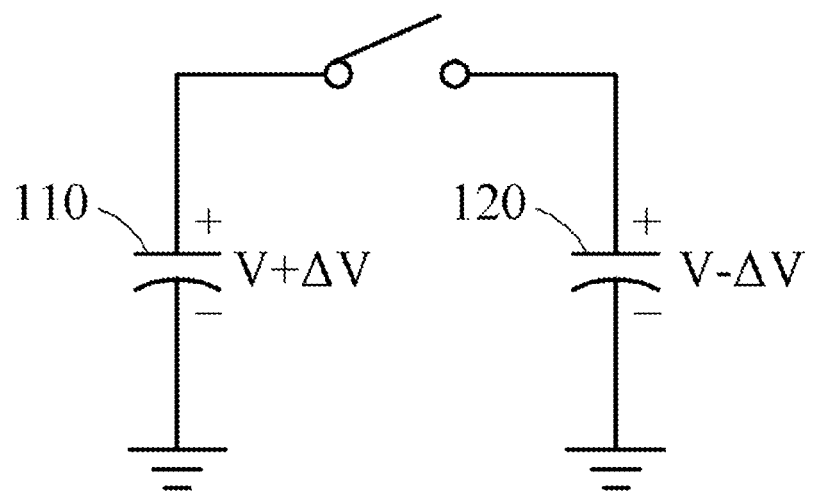
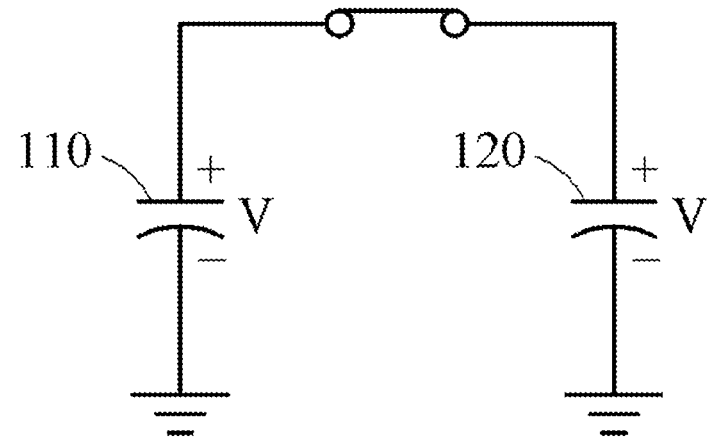
FIG. 1B

FIG. 2A
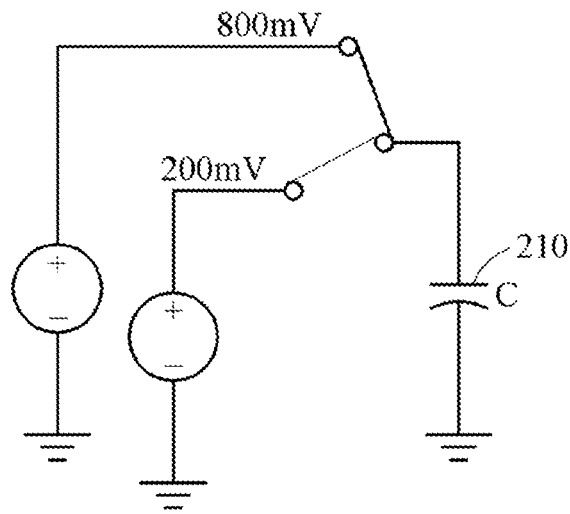
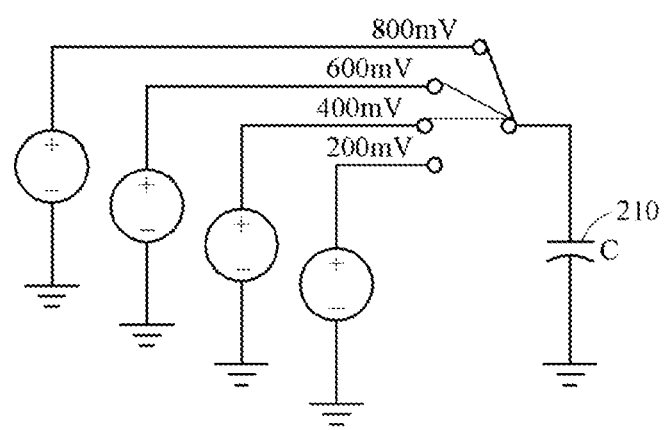
FIG. 2B

Charging from Vin    Discharging to Vout

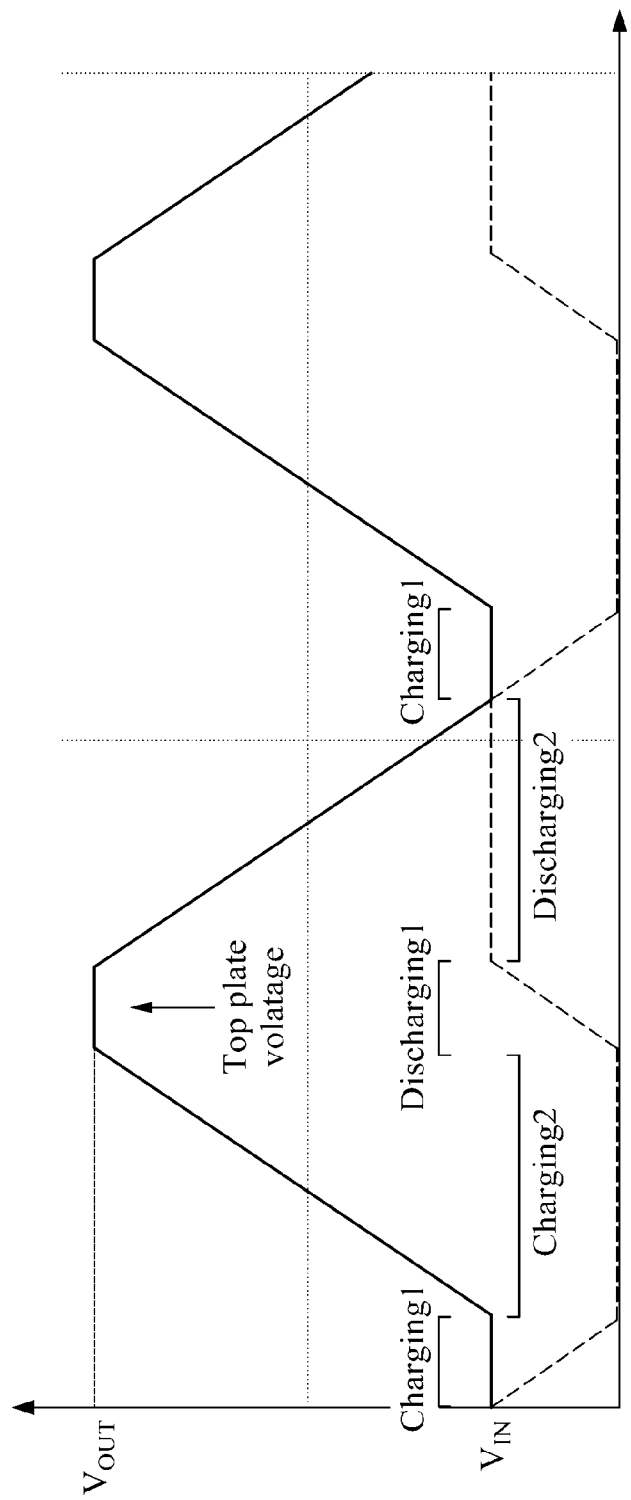

BOOST CONVERTER AND BOOST CONVERTER CELL

CROSS-REFERENCE TO RELATED APPLICATION

This application claims the benefit under 35 USC § 119(a) of Korean Patent Application No. 10-2019-0063680 filed on May 30, 2019 in the Korean Intellectual Property Office, the entire disclosure of which is incorporated herein by reference for all purposes.

BACKGROUND

1. Field

The following description relates to a boost converter that implements soft charging and a cell applicable to the boost converter.

2. Description of Related Art

When an existing direct current-direct current (DC-DC) converter is used, $\Delta V = N \ast V_{IN} - V_{OUT}$, a quantity Q of electric charge transferred during charge sharing is proportional to $\Delta V$, and an energy loss $E_{loss}$ is proportional to $\Delta V^2$. That is, when $\Delta V$ increases, the quantity of electric charge transferred increases, while the energy efficiency for voltage conversion sharply decreases. Thus, technology for maintaining the quantity of electric charge transferred and the energy efficiency for voltage conversion to be constant is desirable.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a cell includes a control circuit configured to generate a bottom control signal related to a bottom plate of a capacitor, and a top control signal related to a top plate of the capacitor to connect the capacitor based on one or more operational phases; and a booster configured to convert the top control signal generated by the control circuit to a converted top control signal by increasing a voltage level of the top control signal; and wherein the capacitor may be configured to be sequentially connected to voltage levels through switches, based on the bottom control signal and the converted top control signal.

The converted top control signal may be a signal which connects the top plate of the capacitor to a voltage level higher than an input voltage, and the bottom control signal may be a signal which connects the bottom plate of the capacitor to a voltage level lower than the input voltage.

The voltage levels may include M voltage levels between an input voltage and a ground GND, and N voltage levels between the input voltage and an output voltage.

The cell may include a phase number adjusting circuit configured to determine the N voltage levels and the M voltage levels.

The phase number adjusting circuit may be configured to determine the N voltage levels between the input voltage and the output voltage based on a potential difference between the output voltage and the input voltage, based on a charge redistribution loss (CRL) and a switching loss.

The phase number adjusting circuit may be configured to determine the M voltage levels between the input voltage and the ground based on a potential difference between the input voltage and the ground, based on a charge redistribution loss (CRL) and a switching loss.

The N voltage levels may increase in response to an increase in a difference between the output voltage and the input voltage, and the M voltage levels may increase in response to an increase in a difference between the input voltage and the ground.

The capacitor may be charged or discharged when sequentially connected to each of the voltage levels based on an input clock.

A variation in a voltage of the charged or discharged capacitor may be determined based on a ratio of an input voltage and N voltage levels.

The control circuit may include an OR gate configured to receive a clock as an input and control the switches.

In a general aspect, a cell includes a control circuit configured to generate a bottom control signal related to a first capacitive plate and a top control signal related to a second capacitive plate to connect a capacitor based on one or more operational phases, a booster configured to convert the top control signal generated by the control circuit to a converted top control signal by increasing a voltage level of the top control signal; and a first capacitor configured to be connected to a voltage level corresponding to a charging phase through a first switch, and a second capacitor configured to be connected to a voltage level corresponding to a discharging phase through a second switch, based on the bottom control signal and the converted top control signal.

The first capacitor to be connected to the voltage level corresponding to the charging phase through the first switch may be charged based on the converted top control signal which connects a top plate of the capacitor to a voltage level higher than an input voltage, and the bottom control signal which connects a bottom plate of the capacitor to a voltage level lower than the input voltage.

The second capacitor configured to be connected to the voltage level corresponding to the discharging phase through the second switch may be discharged by controlling the second switch in an inverse order of the first switch connected to the voltage level corresponding to the charging phase, based on the converted top control signal and the bottom control signal.

The bottom control signal may be configured to connect a bottom plate of a charged capacitor from an input voltage level to a ground through the first switch, and connect a bottom plate of a discharged capacitor from the ground to the input voltage level through the first switch.

The converted top control signal may be configured to connect a top plate of a charged capacitor from an input voltage level to an output voltage level through the second switch, and connect a top plate of the discharged capacitor from the output voltage level to the input voltage level through the second switch.

The voltage levels may include M voltage levels between an input voltage and a ground GND, and N voltage levels between the input voltage and an output voltage.

The cell may include a phase number adjusting circuit configured to determine the N voltage levels and the M voltage levels, wherein the phase number adjusting circuit may be configured to determine the N voltage levels between the input voltage and the output voltage based on a potential difference between the output voltage and the input voltage based on a charge redistribution loss (CRL) and a switching loss, or determine the M voltage levels between the input voltage and the ground based on a potential difference between the input voltage and the ground based on the CRL and the switching loss.

A variation in a voltage of a charged capacitor or a discharged capacitor may be determined based on a ratio of an input voltage and the N voltage levels.

In a general aspect, a boost converter includes a clock divider configured to determine a number of phases, a frequency controller configured to adjust a shifting rate of the clock divider; and at least one cell configured to softly charge or softly discharge a capacitor by controlling switches synchronized with a clock input through the clock divider.

In a general aspect, a method includes generating a bottom control signal to control one or more first switches to sequentially connect a bottom plate of a capacitor to first voltage levels between an input voltage and a ground (GND) to charge or discharge the capacitor, generating a top control signal, converting, with a booster, the top control signal to a converted top control signal; and controlling one or more second switches with the converted top control signal to sequentially connect a top plate of the capacitor to second voltage levels between the input voltage and an output voltage to charge or discharge the capacitor.

Other features and aspects will be apparent from the following detailed description, the drawings, and the claims.

BRIEF DESCRIPTION OF THE DRAWINGS

FIGS. 1A and 1B illustrate an example of a change in energy occurring during charge sharing, in accordance with one or more embodiments.

FIGS. 2A and 2B illustrate an example of charging a capacitor using soft charging, in accordance with one or more embodiments.

FIG. 14 illustrates an example of a change in potential of a top plate of a capacitor and a change in potential of a bottom plate of the capacitor, in accordance with one or more embodiments.

Figure 3:
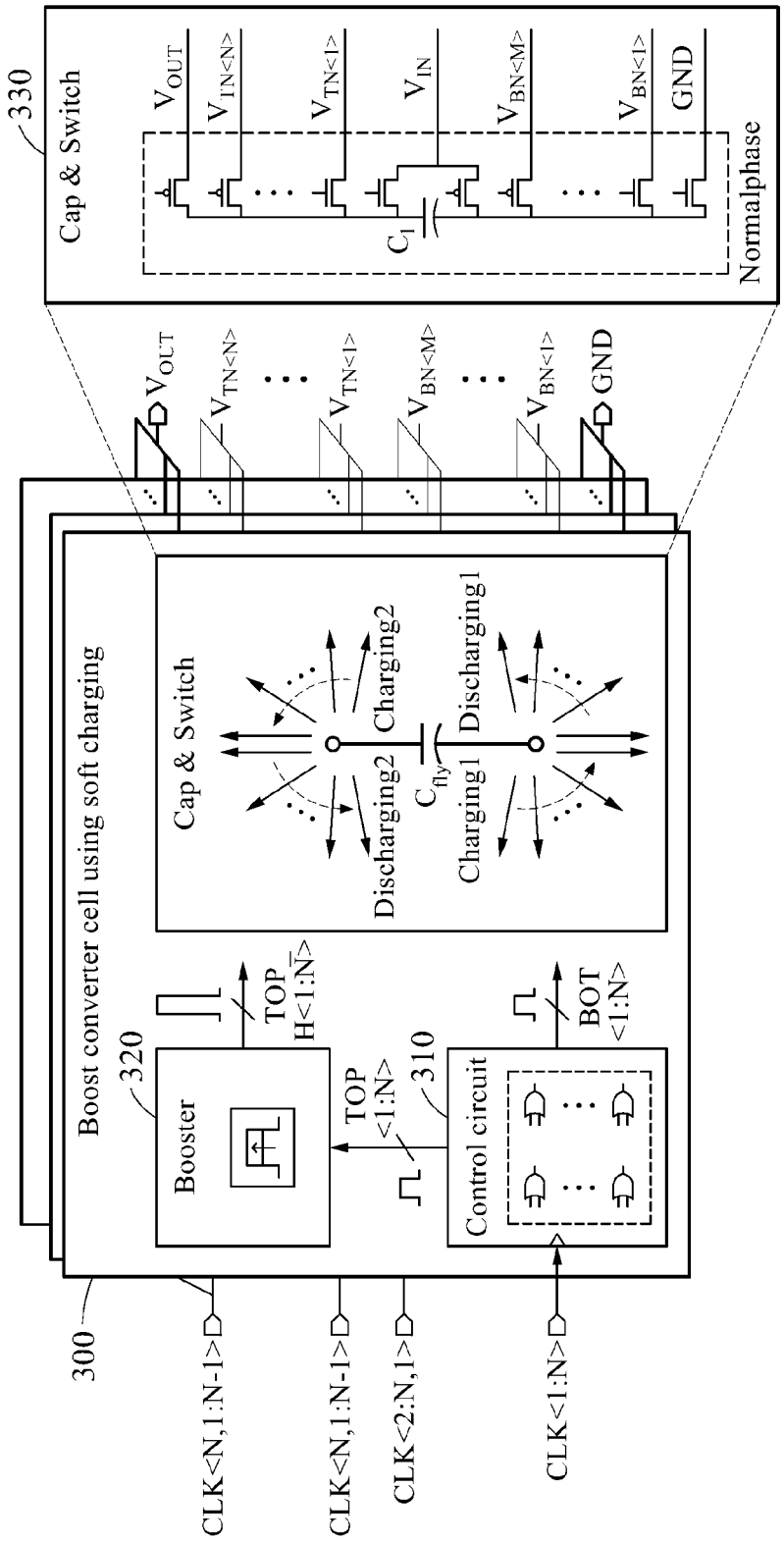
FIG. 3 illustrates an example of a cell applicable to a boost converter, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The terminology used herein is for the purpose of describing particular examples only and is not to be limiting of the examples. As used herein, the singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which this disclosure pertains after an understanding of the present disclosure. It will be further understood that terms, such as those defined in commonly-used dictionaries, should be interpreted as having a meaning that is consistent with their meaning in the context of the relevant art and the present disclosure and will not be interpreted in an idealized or overly formal sense unless expressly so defined herein.

When describing the examples with reference to the accompanying drawings, like reference numerals refer to like constituent elements and a repeated description related thereto will be omitted. In the description of examples, detailed description of well-known related structures or functions will be omitted when it is deemed that such description will cause ambiguous interpretation of the present disclosure.

Hereinafter, examples will be described in detail with reference to the accompanying drawings.

FIGS. 1A and 1B illustrate an example of a change in energy occurring during charge sharing, in accordance with one or more embodiments.

Referring to FIGS. 1A and 1B, a left capacitor 110 and a right capacitor 120 may have the same capacitance C. The left capacitor 110 may be charged with a potential of V+ΔV, and the right capacitor 120 may be charged with a potential of V−ΔV. The capacitors 110, 120 each include a top plate and a bottom plate. When charge sharing is performed by connecting the top plates of the capacitors 110, 120 through a switch connection 130, an electric charge of CΔV is transmitted through the circuit such that the capacitors 110, 120 both have a potential of V. Before charge sharing occurs, the left capacitor 110 and the right capacitor 120 may have energies as expressed by Equation 1 below.

$$\tfrac{1}{2}C(V+\Delta V)^2 + \tfrac{1}{2}C(V-\Delta V)^2 \qquad \text{Equation 1:}$$

After charge sharing occurs, energies of the left capacitor 110 and the right capacitor 120 are expressed by Equation 2 below. Through a comparison of Equation 1 and Equation 2, during charge sharing, an energy of $C\Delta V^2$ is consumed such that an energy of $CV\Delta V$ is exchanged between the two capacitors 110, 120, and the left capacitor 110 and the right capacitor 120 may each have an energy of $\tfrac{1}{2}CV^2$.

$$\tfrac{1}{2}CV^2 + \tfrac{1}{2}CV^2 + (CV\Delta V - CV\Delta V) \qquad \text{Equation 2:}$$

In an example, as a result of comparing Equation 1 and Equation 2, the energy exchanged between the capacitors may be proportional to $\Delta V$, and the energy consumed by charge sharing may be proportional $\Delta V^2$. When an input voltage is converted and output to a predetermined voltage using a switched-capacitor structure, charge sharing is performed. In this example, when a loss decreases in proportion to $\Delta V^2$, the efficiency of charge sharing improves.

If charge sharing is performed N times, a capacitor voltage increases by $\Delta V/N$ through a single charge sharing, and the capacitor voltage increases by $$\left(\frac{\Delta V}{N}\right) * N$$

through N charge sharings. In this example, the energy consumed during the N charge sharings is $$C\left(\frac{\Delta V}{N}\right)^2 N,$$

which is reduced to 1/N when compared to $C\Delta V^2$. In this manner, charging sharing that repeats changing a small voltage a number of times to exchange a small quantity of electric charge is referred to as soft charging. When soft charging is used, the loss occurring in the switched-capacitor structure may be reduced by a factor of 1/N.

FIGS. 2A and 2B illustrate an example of charging a capacitor using soft charging, in accordance with one or more embodiments.

FIG. 2A illustrates an example of charging a 200 mV-charged capacitor 210 to 800 mV by a single switching operation. FIG. 2B illustrates an example of charging a 200 mV-charged capacitor 210 to 400 mV, 600 mV, and 800 mV by three separate switching operations.

In the examples of FIG. 2A and FIG. 2B, the final voltages of the capacitors may equally be 800 mV. However, different energies may be consumed to charge the capacitors to 800 mV. That is, a loss occurring when charging the capacitor to 800 mV through the three processes or operations illustrated in FIG. 2B corresponds to ⅓ a loss occurring when charging the capacitor to 800 mV through the single process or operation as shown in FIG. 2A, whereby the efficiency improves.

Specifically, power may be lost when sequentially charging the capacitor from 200 mV to 400 mV, from 400 mV to 600 mV, and from 600 mV to 800 mV as shown in FIG. 2B. However, the total loss occurring during the sequential charging operation of FIG. 2B may correspond to ⅓ the total loss that may occur during the single charging operation of FIG. 2A. Thus, when soft charging is used, the energy efficiency improves.

FIG. 3 illustrates an example of a cell applicable to a boost converter, in accordance with one or more embodiments.

Referring to FIG. 3, a cell 300 applicable to a boost converter may include a control circuit 310, a booster 320, and a capacitor 330. The capacitor 330 includes a bottom plate and a top plate. The control circuit 310 may include an OR gate configured to receive CLK<1:N> and may connect the capacitor to a corresponding voltage level by controlling switches related to each phase. The booster 320 increases a voltage level of a top control signal to control a switch of a voltage level higher than $V_{IN}$.

The control circuit 310 receives CLK<1:N> and generates a bottom control signal BOT<1:N> to control a connection of the bottom plate of the capacitor to each voltage level, and a top control signal TOP<1:N> to control a connection of the top plate of the capacitor to each voltage level.

In this example, the bottom control signal BOT<1:N> generated by the control circuit 310 controls a switch configured to connect the bottom plate of the capacitor to a voltage level lower than an input voltage $V_{IN}$. However, the top control signal TOP<1:N> generated by the control circuit 310 may not directly control a switch configured to connect the top plate of the capacitor to a voltage level higher than the input voltage $V_{IN}$. Thus, the booster 320 generates a converted top control signal TOP_H<1:N> by converting the top control signal TOP<1:N> so as to swing by an output voltage $V_{OUT}$. The converted top control signal TOP_H<1:N> may directly control the switch configured to connect the top plate of the capacitor to the voltage level higher than the input voltage $V_{IN}$.

In the example of FIG. 3, in a normal phase operation, the bottom control signal BOT<1:N> may control a switch at a voltage level $V_{BN}$<1:N>, and the converted top control signal TOP_H<1:N> may control a switch at a voltage level $V_{TN}$<1:N>.

A cell applicable to a boost converter using soft charging through a switched-capacitor structure may be applicable to an energy harvesting system (for example, a circuit which charges a battery using solar heat or infrared rays) and/or a battery-free system which directly uses received energy.

Figure 4A:
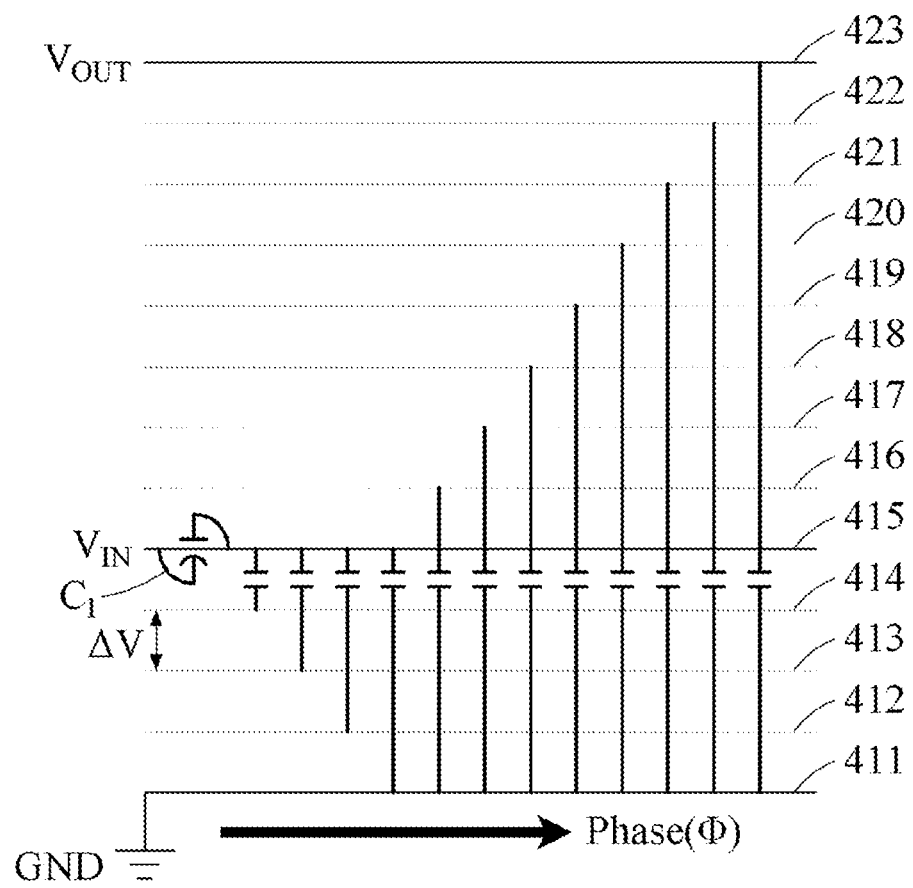
FIGS. 4A and 4B illustrate an example of charging a capacitor with soft charging and transferring power using the charged capacitor, in accordance with one or more embodiments.
Figure 4B:
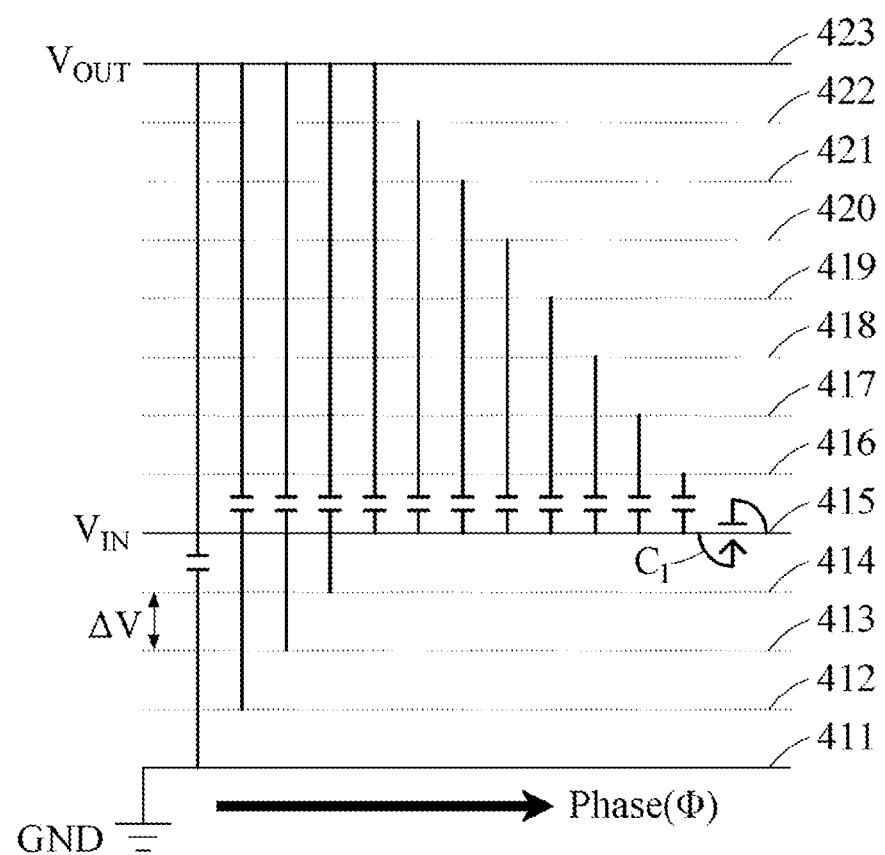

FIGS. 4A and 4B illustrate an example of charging a capacitor implementing soft charging, and transferring power using the charged capacitor, in accordance with one or more embodiments. FIG. 4A illustrates an example of charging a capacitor implementing a virtual voltage level for soft charging, and FIG. 4B illustrates an example of transferring power by implementing the charged capacitor.

FIG. 4A illustrates a process of charging a fully discharged capacitor to $V_{OUT}$. GND denotes a ground, and a horizontal solid line 411 denotes a voltage level corresponding to the ground. $V_{IN}$ denotes an input voltage, and a horizontal solid line 415 denotes a voltage level corresponding to the input voltage $V_{IN}$. $V_{OUT}$ denotes an output voltage, and a horizontal solid line 423 denotes a voltage level corresponding to the output voltage $V_{OUT}$. Dotted lines 412 through 414 denote virtual voltage levels between GND and $V_{IN}$, and dotted lines 416 through 422 denote virtual voltage levels between $V_{IN}$ and $V_{OUT}$. Voltage levels corresponding to a solid line and a dotted line at lower positions are lower than voltage levels corresponding to a solid line and a dotted line at higher positions. For example, the voltage level $V_{OUT}$ corresponding to the solid line 423 is higher than the voltage level $V_{IN}$ corresponding to the solid line 415, which indicates an example of an up-conversion of voltage from $V_{IN}$ to $V_{OUT}$.

In an example, a capacitor symbol is depicted as parallel plates, and a vertical line between a solid line and a dotted line indicating voltage levels indicates connection states of a top plate and a bottom plate of each capacitor.

Referring to FIG. 4A, the leftmost capacitor C1 indicates a state in which both a top plate and a bottom plate of capacitor C1 are connected to the voltage level 415 corresponding to $V_{IN}$, and indicates that the capacitor C1 is fully discharged since there is no potential difference between the top plate and the bottom plate. Referring again to FIG. 4A, the second capacitor C2 from the left indicates a state in which a top plate thereof is connected to the voltage level 415 corresponding to $V_{IN}$, and a bottom plate thereof is connected to a voltage level corresponding to the dotted line 414, which is ΔV lower than $V_{IN}$. In FIG. 4A, the third capacitor C3 from the left indicates a state in which a top plate thereof is connected to the voltage level 415 corresponding to $V_{IN}$, and a bottom plate thereof is connected to a voltage level corresponding to the dotted line 413, which is 2ΔV lower than $V_{IN}$. In the example of FIG. 4A, electric charge of CΔV is used for soft charging through a change of a connection state of a bottom plate or a top plate.

Referring to FIG. 4A, the fifth capacitor C5 from the left indicates a state in which a top plate thereof is connected to the voltage level 415 corresponding to $V_{IN}$, and a bottom plate thereof is connected to the voltage level 411 corresponding to GND, and indicates that the fully discharged capacitor C5 is charged to $V_{IN}$. Then, the top plate of the capacitor is sequentially connected to virtual voltage levels existing between $V_{IN}$ and $V_{OUT}$ at an interval of ΔV, and the $V_{IN}$-charged capacitor is charged to $V_{OUT}$.

FIG. 4B illustrates an example of transferring power with the capacitor charged to $V_{OUT}$. In FIG. 4B, a bottom plate of the leftmost capacitor is connected to the voltage level 411 corresponding to GND, and a top plate thereof is connected to the voltage level 423 corresponding to $V_{OUT}$. Thus, the capacitor is charged to $V_{OUT}$.

When the bottom plate of the capacitor charged to $V_{OUT}$ is sequentially connected to the virtual voltage levels between GND and $V_{IN}$, power is transferred to an output. Further, when a top plate of a capacitor connected between $V_{IN}$ and $V_{OUT}$ is sequentially connected to virtual rails existing between $V_{OUT}$ and $V_{IN}$ at an interval of ΔV, the capacitor is fully discharged by soft discharging. Referring to FIG. 4B, both a top plate and a bottom plate of the rightmost capacitor C1 are connected to the voltage level 415 corresponding to $V_{IN}$, and thus the capacitor is fully discharged.

Thus, the capacitor charged to $V_{OUT}$ by the process of FIG. 4A is fully discharged after transferring power to $V_{OUT}$ through the process of FIG. 4B, and the fully discharged capacitor is charged by the process of FIG. 4A.

Figure 5:
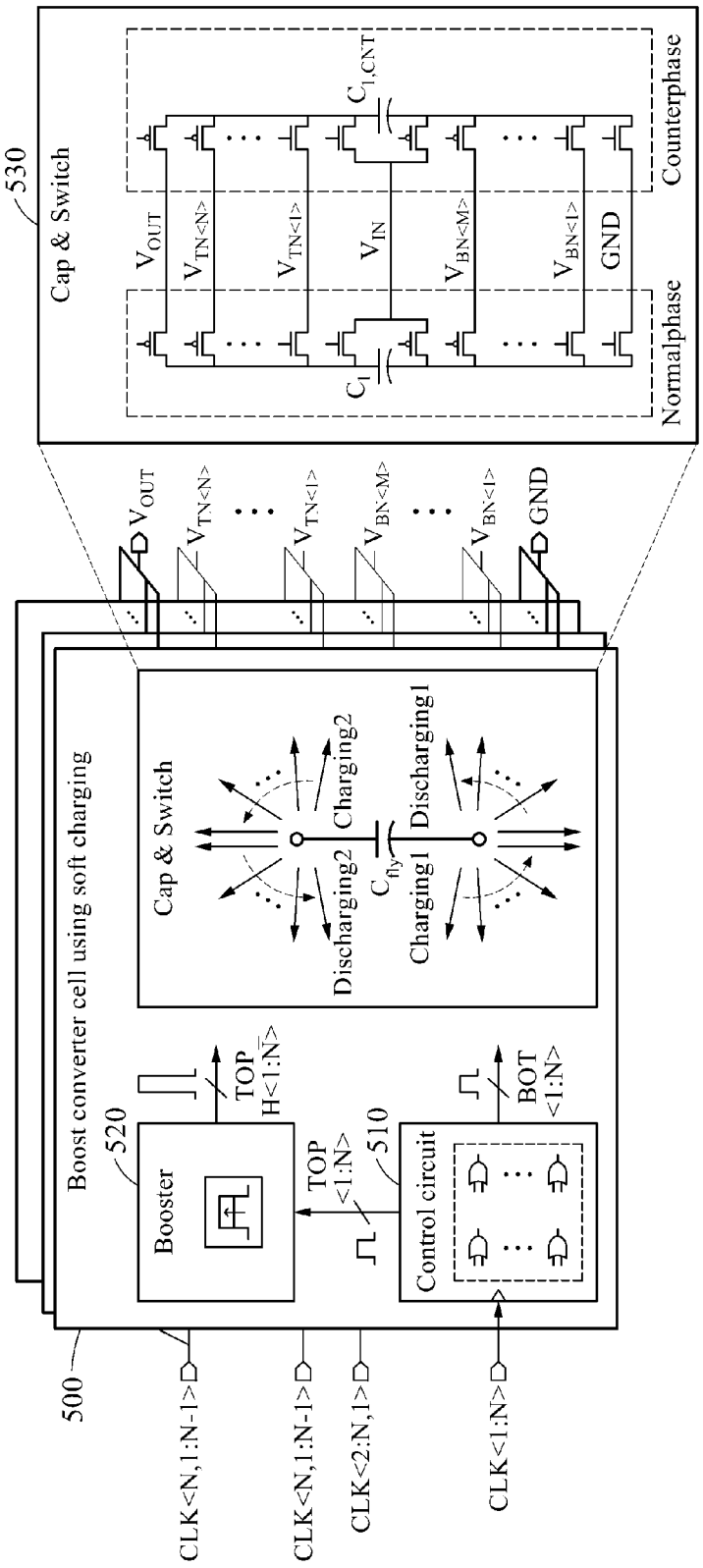
FIG. 5 illustrates an example of a cell applicable to a boost converter, in accordance with one or more embodiments.

FIG. 5 illustrates an example of a cell applicable to a boost converter, in accordance with one or more embodiments.

Referring to FIG. 5, a cell 500 applicable to a boost converter includes a control circuit 510, a booster 520, and a capacitor 530. The capacitor 530 includes a bottom plate and a top plate. The control circuit 510 includes an OR gate configured to receive CLK<1:N> and connect the capacitor to a corresponding voltage level by controlling switches pertaining to each phase. The booster 520 increases a voltage level of a top control signal to control a switch of a voltage level higher than $V_{IN}$.

The control circuit 510 receives CLK<1:N>, and generates a bottom control signal BOT<1:N> to connect the bottom plate of the capacitor to each voltage level, and a top control signal TOP<1:N> to connect the top plate of the capacitor to each voltage level.

In this example, the bottom control signal BOT<1:N> generated by the control circuit 510 controls a switch configured to connect the bottom plate of the capacitor to a voltage level lower than an input voltage $V_{IN}$. However, the top control signal TOP<1:N> generated by the control circuit 510 may not directly control a switch configured to connect the top plate of the capacitor to a voltage level higher than the input voltage $V_{IN}$. Thus, the booster 520 generates a converted top control signal TOP_H<1:N> by converting the top control signal TOP<1:N> so as to swing by an output voltage $V_{OUT}$. The converted top control signal TOP_H<1:N> directly controls the switch configured to connect the top plate of the capacitor to the voltage level higher than the input voltage $V_{IN}$.

When the cell 500 applicable to a boost converter operates in a normal phase, the bottom control signal BOT<1:N> controls a switch at a voltage level $V_{BN}$<1:N>, and the converted top control signal TOP_H<1:N> controls a switch at a voltage level $V_{TN}$1:N>. Further, when the cell 500 applicable to a boost converter operates in a counter phase, the bottom control signal BOT<1:N> controls a switch at a voltage level $V_{BN}$<N:1> in an inverse order of the normal phase, and the converted top control signal TOP_H<1:N> controls a switch at a voltage level $V_{TN}$<N:1> in an inverse order of the normal phase. Here, the counter phase indicates an example in which there is a phase difference of 180 degrees from the normal phase. Unlike the cell of FIG. 3 including the capacitor operating in the normal phase, the cell of FIG. 5 includes capacitors operating in the normal phase and in the counter phase.

Thus, when the bottom control signal BOT<1:N> is used, a bottom plate of the capacitor operating in the normal phase is sequentially connected from GND to $V_{IN}$, and a bottom plate of the capacitor operating in the counter phase is sequentially connected from $V_{IN}$ to GND. Additionally, when the converted top control signal TOP_H<1:N> is used, a top plate of the capacitor operating in the normal phase is sequentially connected from $V_{IN}$ to $V_{OUT}$, and a top plate of the capacitor operating in the counter phase is sequentially connected from $V_{OUT}$ to $V_{IN}$.

In the example of FIG. 3 in which the counter phase is not used, flying capacitor $C_{fly}$ operating in the normal phase may be present in each of P cells. Thus, the total capacitance is $P*C_{fly}$. In FIG. 3, C1 is $C_{fly}$. Conversely, in the example of FIG. 5 in which the normal phase and the counter phase are used, $C_{fly1}$ operating in the normal phase is present in each of P/2 cells, and $C_{fly2}$ operating in the counter phase is present in each of the remaining P/2 cells. Thus, the total capacitance is $P/2*(C_{fly1}+C_{fly2})$. If $C_{fly1}$ equals to $C_{fly2}$, the total capacitance is $P*C_{fly}$. In FIG. 5, C1 is $C_{fly1}$, and $C_{1,CNT}$ is $C_{fly2}$.

A cell applicable to a boost converter using soft charging through a switched-capacitor structure may be implemented in an energy harvesting system (for example, a circuit which charges a battery using solar heat or infrared rays) and/or a battery-free system which directly uses received energy.

FIGS. 6A through 6D illustrate an example of generating a virtual voltage level through a connection of capacitors operating in a counter phase, in accordance with one or more embodiments. Voltages levels of FIGS. 6A through 6D may be the same as the voltage levels of FIGS. 4A and 4B. Capacitors C1 through C24 of FIGS. 6A through 6D have the same capacitance.

Figure 6A:
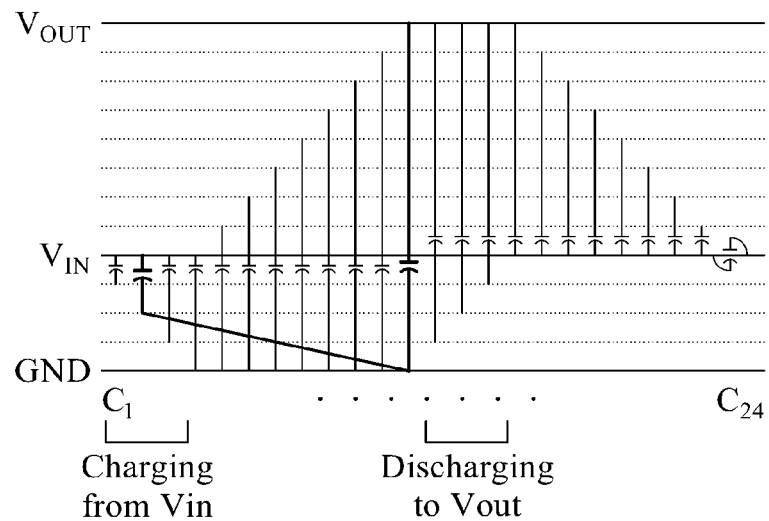
FIGS. 6A through 6D illustrate an example of generating a virtual voltage level through connection of capacitors operating in a counter phase, in accordance with one or more embodiments.
Figure 6B:
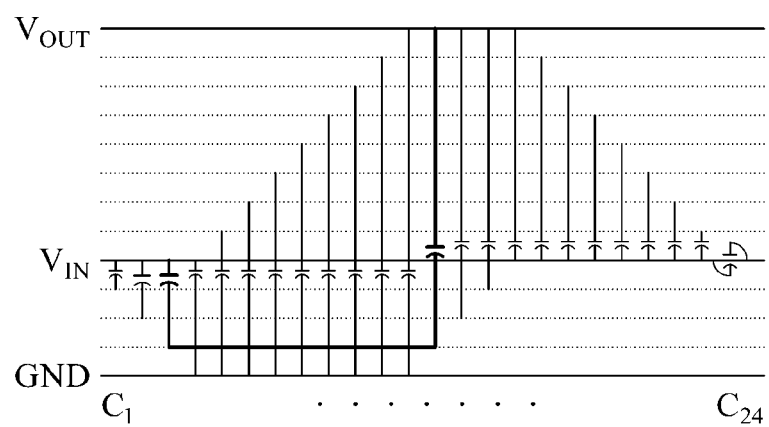

FIGS. 6A and 6B illustrate an example of forming a virtual voltage level through a connection between a capacitor in which a potential of a bottom plate thereof decreases by ΔV and a capacitor in which a potential of a bottom plate thereof increases by ΔV conversely. For example, a potential of a bottom plate of the capacitor C2 decreases by ΔV, and conversely a potential of a bottom plate of the capacitor C12 increases by ΔV. When bottom plates of capacitors having a potential difference of 2ΔV, among capacitors having the counter phase, are connected to each other, one capacitor is charged by ΔV, and the counter-phase capacitor is discharged by ΔV, whereby a virtual voltage level is formed between GND and $V_{IN}$.

Figure 6C:
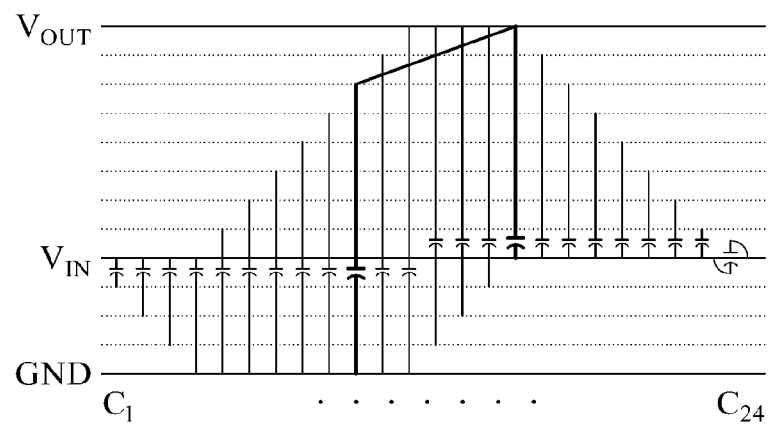
Figure 6D:
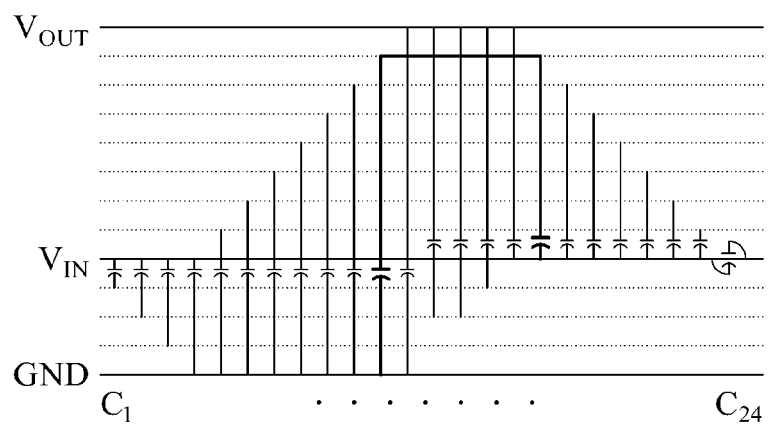

FIGS. 6C and 6D illustrate an example of forming a virtual voltage level through a connection between a capacitor, in which a potential of a top plate thereof increases by ΔV, and a capacitor in which a potential of a top plate thereof decreases by ΔV conversely. For example, a potential of a top plate of the capacitor C10 increases by ΔV, and conversely a potential of a top plate of the capacitor C16 decreases by ΔV. When top plates of capacitors having a potential difference of 2ΔV, among capacitors having the counter phase, are connected to each other, one capacitor is charged by ΔV, and the counter-phase capacitor is discharged by ΔV, whereby a virtual voltage level is formed between $V_{IN}$ and $V_{OUT}$.

When a capacitor operating in the normal phase is connected to the capacitor operating in the counter phase, a virtual voltage level is formed such that an up-conversion switched-capacitor structure reducing a charge redistribution loss (CRL) is implemented. In this example, individual capacitors having a different potential difference for each phase are synchronized with a clock such that power is transferred from $V_{IN}$ to $V_{OUT}$.

Figure 7:
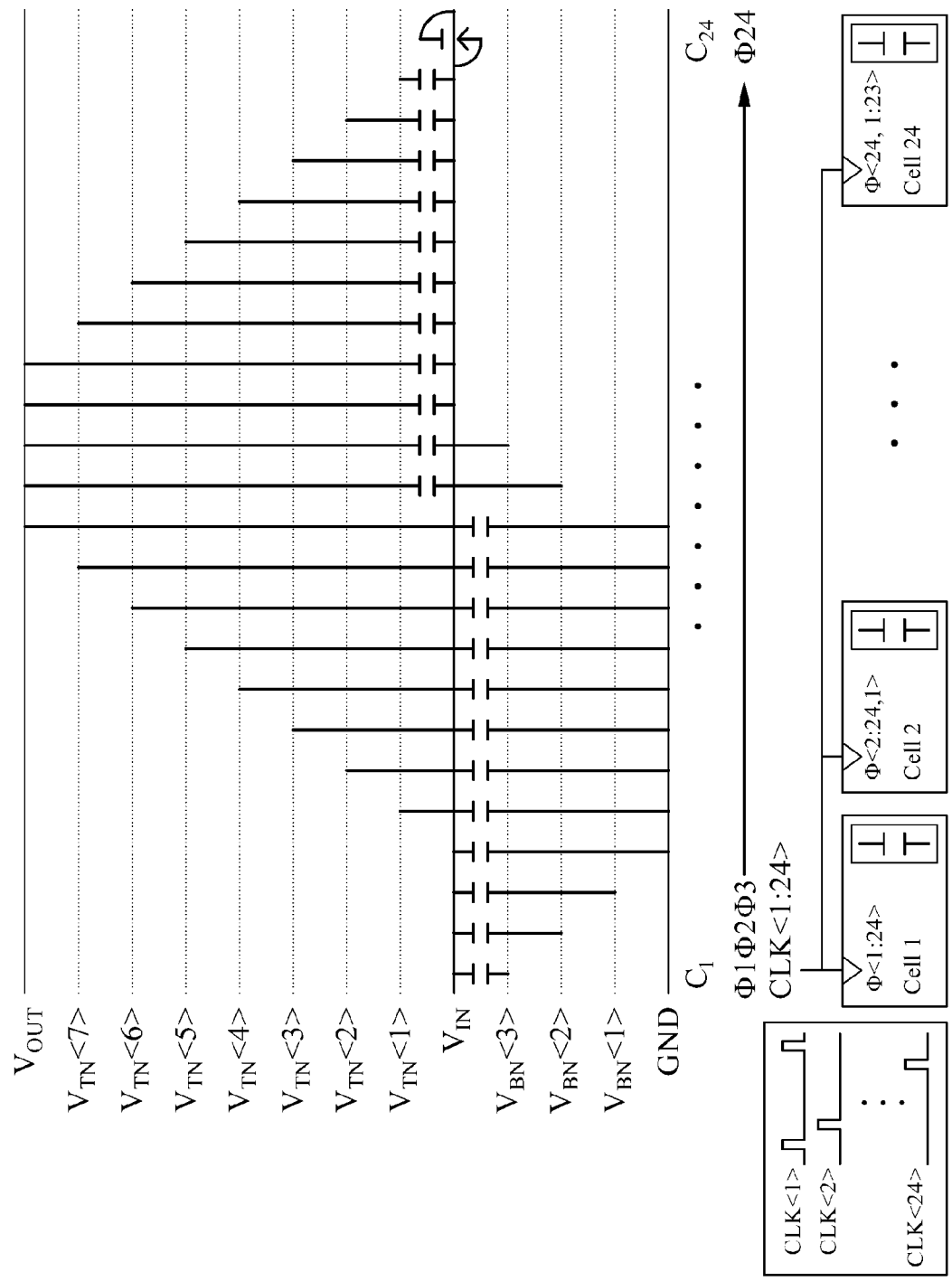
FIG. 7 illustrates an example of controlling capacitors to be positioned in $\Phi_1$ through $\Phi_P$, in a state in which respective cells are synchronized with CLK<1:P>, in accordance with one or more embodiments.

FIG. 7 illustrates an example of controlling capacitors to be positioned in $\Phi_1$ through $\Phi_P$, in a state in which respective cells are synchronized with CLK<1:P>. In an example, it is assumed that P is "24". Thus, a clock is CLK<1:24>, and there are cells 1 through 24 and phases $\Phi_1$ through $\Phi_{24}$. The cell of FIG. 3, which is applicable to a boost converter, may perform an operation as shown in FIG. 7.

In the example of FIG. 7, virtual voltage levels of $V_{BN}<1>$, $V_{BN}<2>$, and $V_{BN}<3>$ may be formed between GND and an input voltage $V_{IN}$ at an interval of ΔV, and virtual voltage levels of $V_{TN}<1>$, $V_{TN}<2>$, $V_{TN}<3>$, $V_{TN}<4>$, $V_{TN}<5>$, $V_{TN}<6>$, and $V_{TN}<7>$ may be formed between $V_{IN}$ and $V_{OUT}$ at an interval of ΔV.

In FIG. 7, the capacitors C1 through C24 may be included in the cells 1 through 24, respectively. For example, the capacitor C1 is included in the cell 1, and the capacitor C2 is included in the cell 2, and a capacitor CP (for example, capacitor C24) is included in a cell P (for example, cell 24). That is, each cell may include a single capacitor.

In an example, at CLK<1>, the cell 1 may control the capacitor C1 to be positioned in the phase $\Phi_1$. In this example, a top plate of the capacitor C1 is connected to $V_{IN}$, and a bottom plate thereof is connected to $V_{BN}<3>$. At CLK<1>, the cell 2 may control the capacitor C2 to be positioned in the phase $\Phi_2$. In this example, a top plate of the capacitor C2 is connected to $V_{IN}$, and a bottom plate thereof is connected to $V_{BN}<2>$. At CLK<1>, the cell 24 may control the capacitor C24 to be positioned in the phase $\Phi_{24}$. In this example, a top plate of the capacitor C24 is connected to $V_{IN}$, and a bottom plate of the capacitor C24 is connected to $V_{IN}$, and thus the capacitor C24 is fully discharged.

At a subsequent clock CLK<2>, the cell 1 may control the capacitor C1 to be positioned in the phase $\Phi_2$, the cell 2 may control the capacitor C2 to be positioned in the phase $\Phi_3$, and the cell 24 may control the capacitor C24 to be positioned in the phase $\Phi_1$. Further, at a subsequent clock CLK<3>, the cell 1 may control the capacitor C1 to be positioned in the phase $\Phi_3$, the cell 2 may control the capacitor C2 to be positioned in the phase $\Phi_4$, and the cell 24 may control the capacitor C24 to be positioned in the phase $\Phi_2$. In this manner, the capacitors are sequentially positioned in the respective phases $\Phi_1$ through $\Phi_{24}$ based on the CLK<1:24>.

Here, the phases $\Phi_1$ through $\Phi_{12}$ each indicate a state in which a capacitor is charged, and the phases $\Phi_{13}$ through $\Phi_{24}$ each indicate a state in which a capacitor is discharged. For example, the phase $\Phi_2$ indicates a state in which the capacitor C2 is charged by CΔV as the bottom plate of the capacitor C2 is connected from $V_{BN}<2>$ to $V_{BN}<1>$, and the phase $\Phi_{23}$ indicates a state in which the capacitor C23 is discharged by CΔV as a top plate of the capacitor C23 is connected from $V_{TN}<2>$ to $V_{TN}<1>$.

Accordingly, when CLK<1:P> is sequentially shifted and input into cells, capacitors are charged or discharged by exchanging electric charge of CΔV for each shifting.

Figure 8:
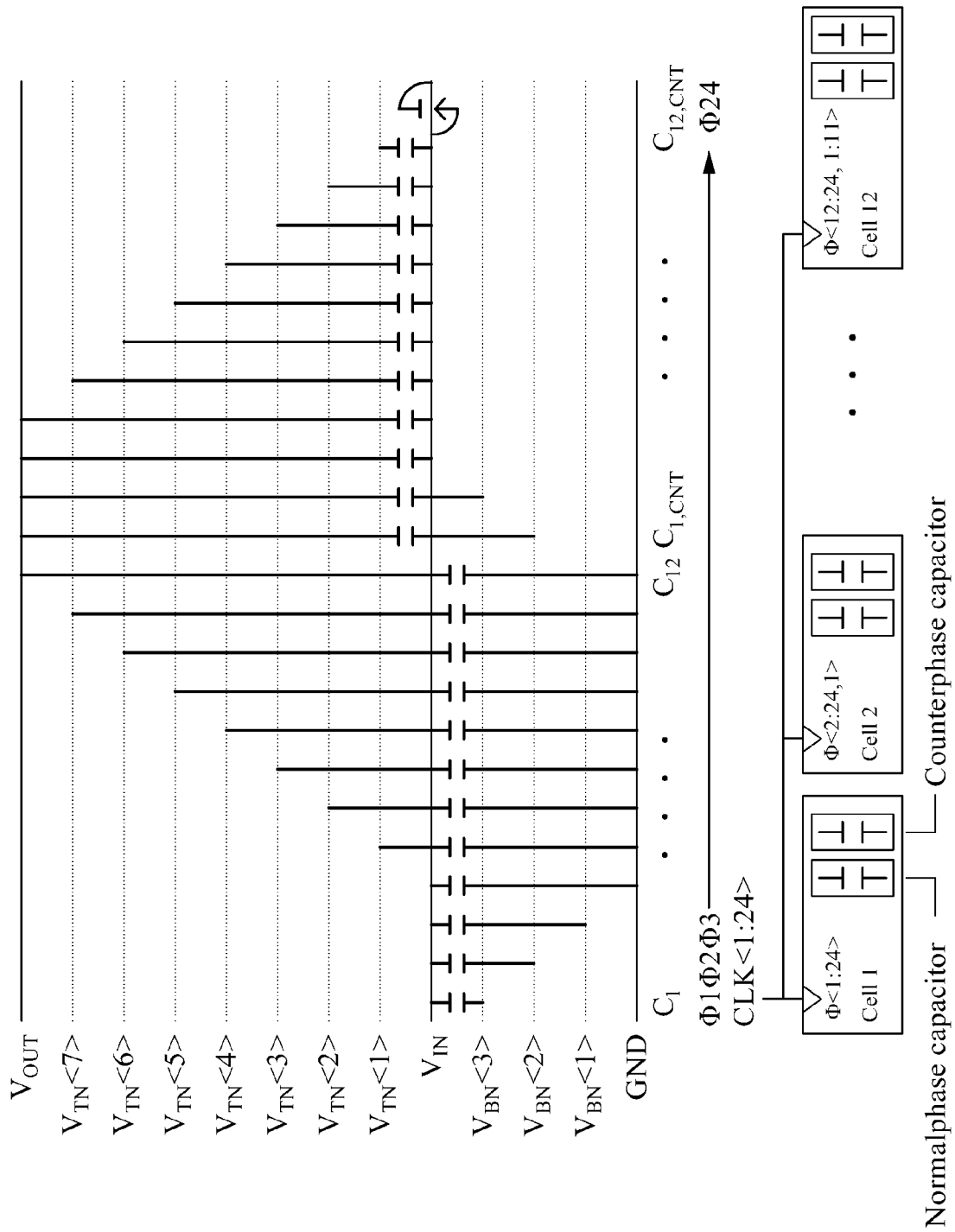
FIG. 8 illustrates an example of binding two 180-shifted capacitors into a single cell with a counter phase, in accordance with one or more embodiments.

FIG. 8 illustrates an example of binding two 180-shifted capacitors into a single cell with a counter phase. In this example, it is assumed that P is "24". Thus, a clock CLK<1:P> is CLK<1:24>, a cell P is a cell 24, and a phase $\Phi_P$ is a phase $\Phi_{24}$. The cell of FIG. 5, which may be applicable to a booster converter implementing a counter phase, may perform an operation as shown in FIG. 8.

In the example of FIG. 8, virtual voltage levels of $V_{BN}<1>$, $V_{BN}<2>$, and $V_{BN}<3>$ may be formed between GND and an input voltage $V_{IN}$ at an interval of ΔV, and virtual voltage levels of $V_{TN}<1>$, $V_{TN}<2>$, $V_{TN}<3>$, $V_{TN}<4>$, $V_{TN}<5>$, $V_{TN}<6>$, and $V_{TN}<7>$ may be formed between $V_{IN}$ and $V_{OUT}$ at an interval of $\Delta V$.

Unlike the example of FIG. 7 in which a single capacitor is included in each cell, FIG. 8 illustrates an example in which capacitors operable using an inverted signal, among capacitors C1 through C24, may be included in one cell. Specifically, among the capacitors C1 through C12 positioned in the charging phases $\Phi_1$ through $\Phi_{12}$ and the capacitors C13 through C24 positioned in the discharging phases $\Phi_{13}$ through $\Phi_{24}$, two capacitors shifted 180 degrees may be included in one cell using a counter phase at CLK<1>.

In an example, the two capacitors shifted 180 degrees may be capacitors with $\Delta\Phi=12$. For example, at CLK<1>, the cell 1 includes the normal-phase capacitor C1 positioned in the phase $\Phi_1$ and the counter-phase capacitor C13 positioned in the phase $\Phi_{13}$, and the cell 12 includes the normal-phase capacitor C12 positioned in the phase $\Phi_{12}$ and the counter-phase capacitor C24 positioned in the phase $\Phi_{24}$. In FIG. 8, the counterphase capacitor $C_{1,CNT}$ is capacitor C13, and the counterphase capacitor $C_{12,CNT}$ is capacitor C24.

At a subsequent clock CLK<2>, the cell 1 may include the normal-phase capacitor C2 positioned in the phase $\Phi_2$ and the counter-phase capacitor C14 positioned in the phase $\Phi_{14}$, and the cell 12 may include the normal-phase capacitor C13 positioned in the phase $\Phi_{13}$ and the counter-phase capacitor C1 positioned in the phase $\Phi_1$. When CLK<1:P> is sequentially shifted and input into cells, capacitors are charged/discharged by exchanging electric charge of $C\Delta V$ for each shifting.

When the counter phase is used as in FIG. 8, the operation of FIG. 7 is performed with a half of the total number of cells of FIG. 7. For example, when P is "24", 24 cells may be needed in the example of FIG. 7, whereas the operation of FIG. 7 is performed using 12 cells in the example of FIG. 8.

Figure 9:
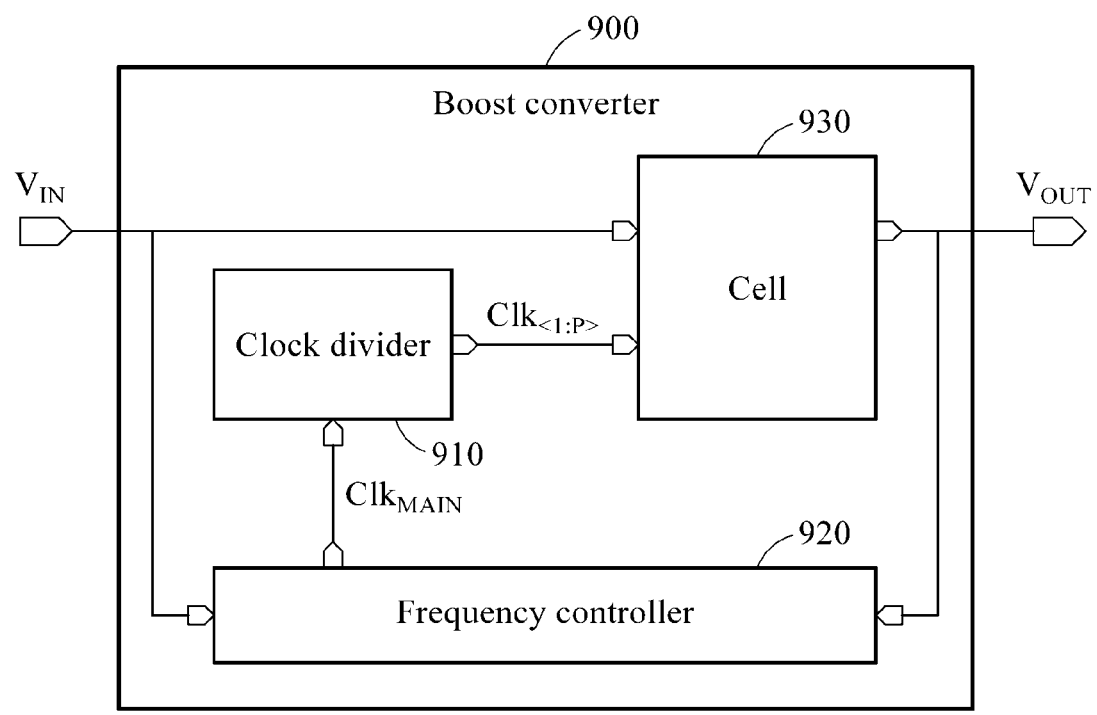
FIG. 9 illustrates an example of a boost converter, in accordance with one or more embodiments.

FIG. 9 illustrates an example of a boost converter.

Referring to FIG. 9, a switch-cap type boost converter 900 implementing soft charging may include a clock divider 910, a frequency controller 920, and a cell 930. In an example, the boost converter 900 transfers power from an input to an output through voltage up-conversion, and the cell 930 may include a plurality of cells. The cell 930 operates in the manner described with reference to FIGS. 7 and 8, and thus a duplicated description will be omitted for brevity.

The clock divider 910 sequentially executes CLK corresponding to the number of phases, and the frequency controller 920 senses an input voltage or an output voltage and controls the input or output voltage depending on a particular purpose of the boost converter 9000. For example, in an example of a system voltage regulation, the frequency controller 920 may control a frequency to regulate the output voltage to a target voltage. Further, in example of a battery charger, the frequency controller 920 may control a frequency to regulate the output voltage to an input voltage at a maximum power point.

Figure 10:
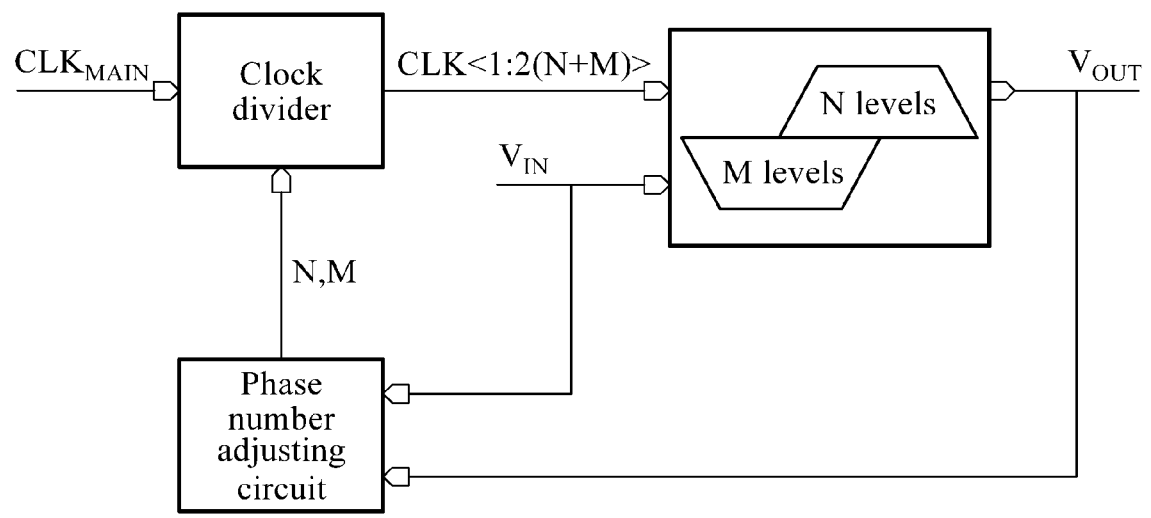
FIG. 10 illustrates an example of a phase number adjusting circuit, in accordance with one or more embodiments.
Figure 11:
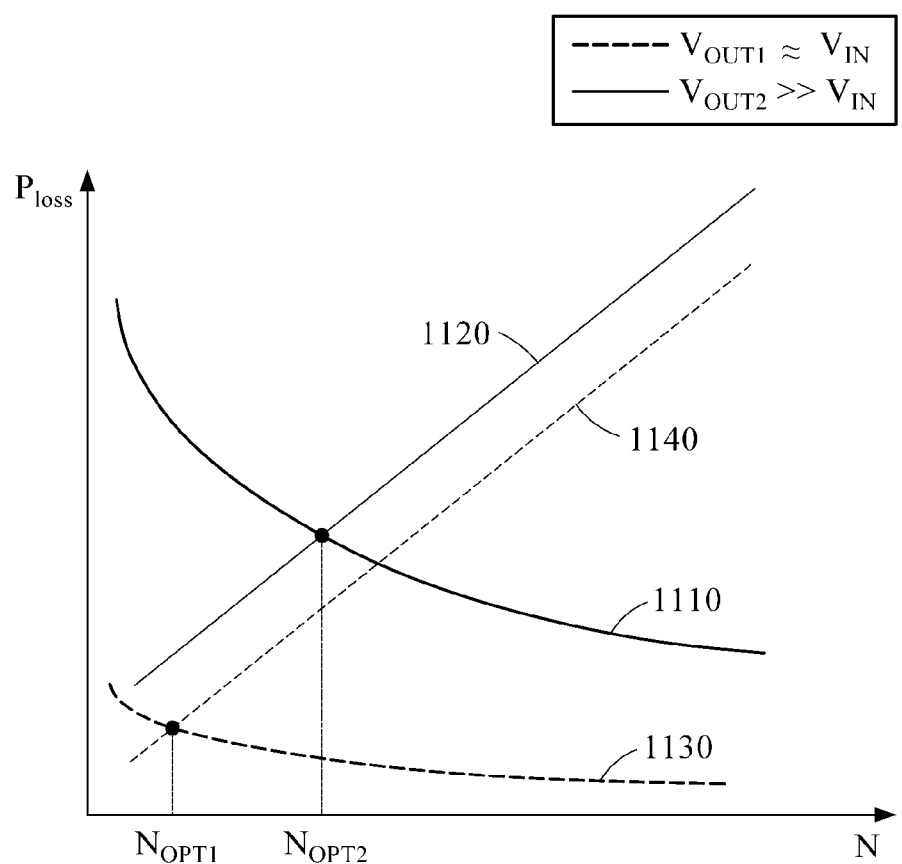
FIG. 11 illustrates an example of a change in N in response to a difference between $V_{OUT}$ and $V_{IN}$, in accordance with one or more embodiments.

FIG. 10 illustrates an example of a phase number adjusting circuit. FIG. 11 illustrates an example of a change in virtual voltage levels N in response to a difference between $V_{OUT}$ and $V_{IN}$.

A boost converter may further include a phase number adjusting circuit. In FIG. 10, N denotes the number of virtual voltage levels between $V_{OUT}$ and $V_{IN}$, and M denotes the number of virtual voltage levels between $V_{IN}$ and GND. In an example, M and N are determined such that the energy loss $P_{loss}$ occurring in response to changes in $V_{OUT}$ and $V_{IN}$ is minimized. In an example, $P_{loss}$ is determined based on a charge redistribution loss (CRL) and a switching loss SWloss.

In FIG. 11, a graph 1110, 1130 is a graph of a CRL occurring in response to a difference between $V_{OUT}$ and $V_{IN}$, and a graph 1120, 1140 is a graph of a switching loss SWloss occurring in response to a difference between $V_{OUT}$ and $V_{IN}$.

$N_{OPT1}$ is determined based on the CRL 1130 and the switching loss 1140 when a difference between $V_{OUT1}$ and $V_{IN}$ is less than a difference between $V_{OUT2}$ and $V_{IN}$. $N_{OPT2}$ is determined based on the CRL 1110 and the switching loss 1120 when the difference between $V_{OUT2}$ and $V_{IN}$ is greater than the difference between $V_{OUT1}$ and $V_{IN}$. That is, when $V_{OUT}$ changes, $N_{OPT}$ minimizing the power loss changes. The phase number adjusting circuit of FIG. 10 determines $N_{OPT}$ minimizing the power loss.

Similarly, $M_{OPT}$ minimizing the power loss is determined based on a difference between $V_{IN}$ and GND. The phase number adjusting circuit of FIG. 10 determines $M_{OPT}$ minimizing the power loss.

In detail, the phase number adjusting circuit of FIG. 10 determines $N_{OPT}$ and $M_{OPT}$ minimizing the power loss based on the following equations. A CRL occurring per hour is determined based on Equation 3 below. In Equation 3, fclk denotes an operation count of a cell per second, and $C_{fly}$ denotes a capacitance of a capacitor included in each cell.

$$fclk\left[2M*\left(\frac{VIN}{M}\right)^2 *Cfly + 2N*\left(\frac{VOUT-VIN}{N}\right)^2 *Cfly\right] \quad \text{Equation 3}$$

A CRL of $C_{fly}*(V_{IN}/M)^2$ occurs on a bottom plate due to a potential change of $(V_{IN}/M)$ in a capacitor with the capacitance $C_{fly}$. Thus, a CRL of $2M*C_{fly}*(V_{IN}/M)^2$ occurs on 2M bottom plates. Similarly, a CRL of $2N*C_{fly}*((V_{OUT}-V_{IN})/N)^2$ occurs on a top plate. A CRL of $2M*C_{fly}*(V_{IN}/M)^2+2N*C_{fly}*((V_{OUT}-V_{IN})/N)^2$ occurs in response to a single phase change, and thus the CRL occurring per hour is expressed by Equation 3.

A switching loss SWloss is determined based on Equation 4 below. In Equation 4, $\alpha$ denotes a coefficient for reflecting a switching loss caused by a parasitic capacitor existing in a control circuit, and $\beta$ denotes a coefficient for reflecting a switching loss caused by a parasitic capacitor existing in a booster.

$$fclk[2(M+N)*\alpha VIN^2+2N*\beta VOUT^2] \quad \text{Equation 4:}$$

The power loss $P_{loss}$ is determined based on Equation 5 below. Thus, the phase number adjusting circuit determines N and M such that $P_{loss}$ is minimized in response to changes in $V_{OUT}$ and/or $V_{IN}$.

$$P_{loss} = CRL + SW\text{ loss} = f_{CRL}\left(\frac{1}{N},\frac{1}{M}\right) + f_{SW}(N,M) \quad \text{Equation 5}$$

Figure 12:
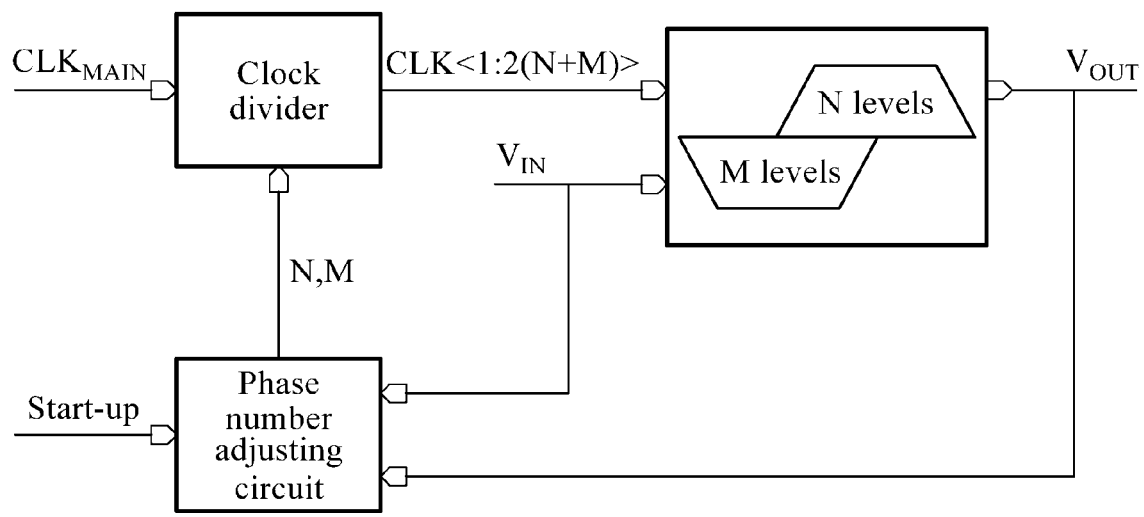
FIG. 12 illustrates an example of a phase number adjusting circuit considering a start-up, in accordance with one or more embodiments.

FIG. 12 illustrates an example of a phase number adjusting circuit considering a start-up. FIGS. 10 and 11 illustrate an example in which a phase number adjusting circuit determines N and M such that an energy loss Ross occurring in a steady state is minimized, while FIG. 12 illustrates a process before the steady state is reached.

By dynamically adjusting the number of virtual voltage levels generated for soft charging, an operation is performed with an optimal efficiency depending on an application, or a start-up time is advanced. For example, when the number of virtual voltage levels decreases by binding several virtual voltage levels, a capacitance of each capacitor increases, a pumping capacity improves, and thus a fast start-up is enabled. In this example, when there are a relatively large number of virtual voltage levels, a power consumption for moving electric charge between capacitors decreases, while a switching power consumption for generating each voltage level increases. Conversely, when there are a relatively few number of virtual voltage levels, the power consumption for moving electric charge between capacitors increases, while the switching power consumption decreases. Thus, an optimal efficiency is obtained by determining the number of virtual voltage levels appropriate for input and output voltages and an output power situation. Further, in a hybrid form, a fast start-up time is obtained by binding several virtual voltage levels at an early stage, and the number of virtual voltage levels may be adjusted to be suitable for the optimal efficiency after the start-up.

In an example, an output current $I_{OUT}$ corresponding to an output voltage $V_{OUT}$ is expressed by Equation 6 below. In an example, unit capacitance denotes a capacitance $C_{fly}$ of a capacitor in each cell. If there are a total of 2(N+M) cells, the total capacitance $C_{total}=2(N+M)*C_{fly}$ is satisfied.

$$I_{OUT}=\text{frequency}*\text{number of cells}*\Delta V*\text{unit capacitance} \quad \text{Equation 6:}$$

An output current $I_{OUT\_normal}$ in the steady state is expressed by Equation 7 below, and an output current $I_{OUT\_start-up}$ in the start-up process is expressed by Equation 8 bellow. Thus, when $I_{OUT}$ increases by binding K capacitors in a cell at an early stage, a start-up time from a start point to a point where the steady state is reached decreases. That is, when a start-up signal indicating an initial state is received, the phase number adjusting circuit increases K, increases $I_{OUT}$, quickly increases $V_{OUT}$, and thereby decreases the start-up time. After that, when $V_{OUT}$ reaches a target voltage, K decreases to improve the efficiency.

$$I_{OUT\_normal} = fclk * M * \left(\frac{VIN}{M}\right) * Cfly \quad \text{Equation 7}$$

$$I_{OUT_{start-up}} = fclk * \frac{M}{K} * \left(\frac{VIN}{M/K}\right) * (K*Cfly) = K*I_{OUT\_normal} \quad \text{Equation 8}$$

Figure 13:
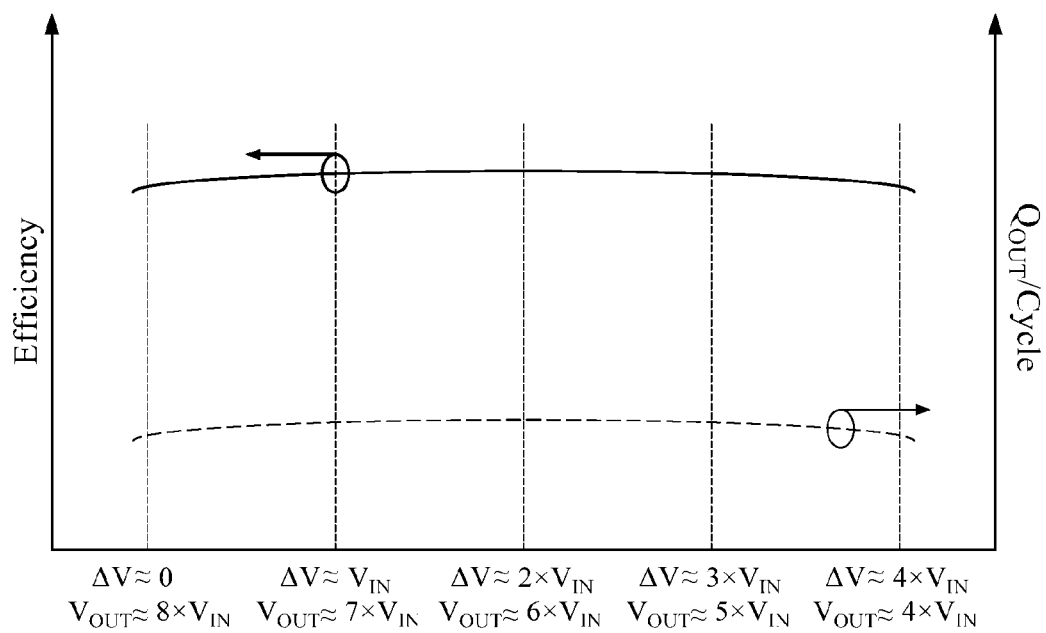
FIG. 13 illustrates an example of an efficiency and $Q_{OUT}$ when soft charging is used, in accordance with one or more embodiments.

FIG. 13 illustrates an example of an efficiency and $Q_{OUT}$ when soft charging is implemented.

When an interval of virtual voltage levels is uniformly $\Delta V$, $C\Delta V$ transmitted from an input to an output in a single cycle is constant. Thus, a uniform efficiency is maintained despite a change in a ratio of the input and the output. Here, $\Delta V=V_{IN}/N$ is determined irrespective of $V_{OUT}$, whereby the uniform efficiency is maintained. That is, when soft charging is implemented, the peak efficiency and the average efficiency may have similar values, and thus a relatively high efficiency may be maintained.

FIG. 14 illustrates an example of a change in potential of a top plate of a capacitor and a change in potential of a bottom plate of the capacitor. A capacitor is charged or discharged by soft charging as a phase changes based on a CLK. Specifically, i) in a period of charging, Charging1, the capacitor is charged as a potential of a bottom plate of the capacitor changes from $V_{IN}$ to GND while a potential of a top plate of the capacitor is uniformly $V_{IN}$. Further, ii) in a period of charging, Charging2, the capacitor is charged as the potential of the top plate of the capacitor changes from $V_{IN}$ to $V_{OUT}$ while the potential of the bottom plate of the capacitor is uniformly GND. Further, iii) in a period of discharging, Discharging1, the capacitor is discharged as the potential of the bottom plate of the capacitor changes from GND to $V_{IN}$ while the potential of the top plate of the capacitor is uniformly $V_{OUT}$. Further, iv) in a period of discharging, Discharging2, the capacitor is discharged as the potential of the top plate of the capacitor changes from $V_{OUT}$ to $V_{IN}$ while the potential of the bottom plate of the capacitor is uniformly $V_{IN}$.

The cells 300 and 500, the boost converter 900, described herein with respect to FIGS. 1-14, and that perform operations described in this application, are implemented as and by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-14 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. The instructions or software may be written using any programming language based on the block diagrams and the flow charts illustrated in the drawings and the corresponding descriptions in the specification, which disclose algorithms for performing the operations performed by the hardware components and the methods as described above.

The instructions or software to control computing hardware, for example, one or more processors or computers to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A cell comprising:
 a control circuit configured to generate a bottom control signal related to a bottom plate of a capacitor, and a top control signal related to a top plate of the capacitor to connect the capacitor based on one or more operational phases; and
 a booster configured to convert the top control signal generated by the control circuit to a converted top control signal by increasing a voltage level of the top control signal;
 wherein the capacitor is configured to be sequentially connected to voltage levels through switches, based on the bottom control signal and the converted top control signal, and
 wherein a variation in a voltage of the capacitor in a charged state or the capacitor in a discharged state is determined based on a ratio of an input voltage and N voltage levels.

2. The cell of claim 1, wherein the converted top control signal is a signal which connects the top plate of the capacitor to a voltage level higher than an input voltage, and
 the bottom control signal is a signal which connects the bottom plate of the capacitor to a voltage level lower than the input voltage.

3. The cell of claim 1, wherein the voltage levels comprise M voltage levels between an input voltage and a ground GND, and N voltage levels between the input voltage and an output voltage.

4. The cell of claim 3, further comprising:
 a phase number adjusting circuit configured to determine the N voltage levels and the M voltage levels.

5. The cell of claim 4, wherein the phase number adjusting circuit is configured to determine the N voltage levels between the input voltage and the output voltage based on a potential difference between the output voltage and the input voltage, based on a charge redistribution loss (CRL) and a switching loss.

6. The cell of claim 4, wherein the phase number adjusting circuit is configured to determine the M voltage levels between the input voltage and the ground based on a potential difference between the input voltage and the ground, based on a charge redistribution loss (CRL) and a switching loss.

7. The cell of claim 3, wherein the N voltage levels increase in response to an increase in a difference between the output voltage and the input voltage, and the M voltage levels increase in response to an increase in a difference between the input voltage and the ground.

8. The cell of claim 1, wherein the capacitor is charged or discharged when sequentially connected to each of the voltage levels based on an input clock.

9. The cell of claim 1, wherein the control circuit comprises an OR gate configured to receive a clock as an input and control the switches.

10. A cell comprising:
- a control circuit configured to generate a bottom control signal related to a first capacitive plate and a top control signal related to a second capacitive plate to connect a capacitor based on one or more operational phases;
- a booster configured to convert the top control signal generated by the control circuit to a converted top control signal by increasing a voltage level of the top control signal; and
- a first capacitor configured to be connected to a voltage level corresponding to a charging phase through a first switch, and a second capacitor configured to be connected to a voltage level corresponding to a discharging phase through a second switch, based on the bottom control signal and the converted top control signal.

11. The cell of claim 10, wherein the first capacitor to be connected to the voltage level corresponding to the charging phase through the first switch is charged based on the converted top control signal which connects a top plate of the capacitor to a voltage level higher than an input voltage, and the bottom control signal which connects a bottom plate of the capacitor to a voltage level lower than the input voltage.

12. The cell of claim 11, wherein the second capacitor configured to be connected to the voltage level corresponding to the discharging phase through the second switch is discharged by controlling the second switch in an inverse order of the first switch connected to the voltage level corresponding to the charging phase, based on the converted top control signal and the bottom control signal.

13. The cell of claim 10, wherein the bottom control signal is configured to connect a bottom plate of a charged capacitor from an input voltage level to a ground through the first switch, and connect a bottom plate of a discharged capacitor from the ground to the input voltage level through the first switch.

14. The cell of claim 10, wherein the converted top control signal is configured to connect a top plate of a charged capacitor from an input voltage level to an output voltage level through the second switch, and connect a top plate of the discharged capacitor from the output voltage level to the input voltage level through the second switch.

15. The cell of claim 10, wherein the voltage levels comprise M voltage levels between an input voltage and a ground GND, and N voltage levels between the input voltage and an output voltage.

16. The cell of claim 15, further comprising:
- a phase number adjusting circuit configured to determine the N voltage levels and the M voltage levels,
- wherein the phase number adjusting circuit is configured to determine the N voltage levels between the input voltage and the output voltage based on a potential difference between the output voltage and the input voltage based on a charge redistribution loss (CRL) and a switching loss, or determine the M voltage levels between the input voltage and the ground based on a potential difference between the input voltage and the ground based on the CRL and the switching loss.

17. The cell of claim 10, wherein a variation in a voltage of a charged capacitor or a discharged capacitor is determined based on a ratio of an input voltage and the N voltage levels.

18. A boost converter, comprising:
- a clock divider configured to determine a number of phases;
- a frequency controller configured to adjust a shifting rate of the clock divider; and
- at least one cell configured to softly charge or softly discharge a capacitor by controlling switches synchronized with a clock input through the clock divider,
- wherein a variation in a voltage of the capacitor in a charged state or the capacitor in a discharged state is determined based on a ratio of an input voltage and N voltage levels.

* * * * *